United States Patent [19]

Kennedy

[11] 4,368,519
[45] Jan. 11, 1983

[54] ENERGY UTILIZATION OR CONSUMPTION RECORDING METHOD

[75] Inventor: Stanley P. Kennedy, Sparks, Md.

[73] Assignee: Emax, Incorporated, Cockeysville, Md.

[21] Appl. No.: 174,854

[22] Filed: Aug. 4, 1980

Related U.S. Application Data

[62] Division of Ser. No. 31,848, Apr. 20, 1979, Pat. No. 4,236,217.

[51] Int. Cl.³ .............................................. G01D 9/00
[52] U.S. Cl. .............................. 364/483; 235/92 EL; 235/432; 324/113; 346/14 MR; 364/900
[58] Field of Search ............... 364/483, 492, 493, 900; 346/14 MR; 360/6; 235/92 EL, 432; 324/113; 340/870.02, 870.04

[56] References Cited

U.S. PATENT DOCUMENTS

| | | | |
|---|---|---|---|
| 3,422,441 | 1/1969 | Chapsky | 346/14 MR |
| 3,921,207 | 11/1975 | Doby et al. | 324/113 |
| 3,932,730 | 1/1976 | Ambrosio | 346/14 MR |
| 4,218,737 | 8/1980 | Buscher et al. | 364/900 |
| 4,233,590 | 11/1980 | Gilkeson et al. | 235/92 EL |
| 4,240,030 | 12/1980 | Bateman et al. | 346/14 MR |

*Primary Examiner*—Errol A. Krass
*Attorney, Agent, or Firm*—Reginald F. Pippin, Jr.

[57] ABSTRACT

Energy utilized or consumed at a given location or facility causes pulses to be generated as a function of the instant rate of energy use, and such pulses are counted during succeeding discrete time intervals. The succeeding interval summation count values are recorded in digital form at respective discrete locations in a memory, particularly on an ultraviolet (UV) light-erasable PROM (EPROM) contained in a removable cartridge having a UV substantially opaque case. The interval summation count values are summed to provide a grand total energy or power utilization or consumption figure which is fed into and stored at a discrete location in the EPROM memory at the end of the recording period. The succeeding interval counts are successively compared and the peak count value for that interval having the greatest energy usage within a particular total time period composed of a multiple of such succeeding discrete time intervals is recorded on the EPROM at the conclusion of the particular total time period and the cartridge is removed, after having also recorded on the EPROM in digital data form and at respective discrete memory locations the respective times of beginning and end of the particular total time period of energy use measurement and recording, as well as recording thereon the place or location of the energy use facility whose energy use is being measured and recorded.

35 Claims, 2 Drawing Figures

ENERGY UTILIZATION OR CONSUMPTION RECORDING METHOD

DISCLOSURE

This application is a division of my copending application Ser. No. 31,848 filed Apr. 20, 1979 and now U.S. Pat. No. 4,236,217 for Energy Utilization or Consumption Recording Arrangement.

This invention relates to the recording of data on interval, total and peak usage or consumption of electrical energy, and more particularly to a method for recording such data in a memory, particularly and preferably on a programmable read-only memory (PROM) contained within a removable cartridge, which PROM, in the highly preferred embodiment aspect, is an ultraviolet (UV) light-erasable programmable read-only memory (EPROM), the cartridge case being UV opaque or having a UV opaque case section or cover over at least the UV-sensitive erasable portion of the EPROM.

For purposes of this application the terms utilization, usage, and consumption are used synonymously and interchangeably in the sense that energy or power is inputted to a consumer or user.

Electric utility companies use a unit called peak demand to charge their customers for the increased capacity of power generation that they have to provide in order to supply their customers the peak demand. A device is used which is called a peak demand recorder, such being employed for large customers to record information from which this peak demand as well as the total power usage by the customer can be derived, and from this recorded information the utility will compute the charges for a given customer for a given period of electrical energy usage.

The peak demand recorder and method of energy use recording which has been conventionally and widely used takes the form of a conventional mechanical type tape recorder using a magnetic tape cassette or magnetic tape data cartridge, and the electrical pulses that come from the utility meter in the form of contact closures are recorded on an energy consumption channel on the magnetic tape. In addition, a time indexing tick is recorded on a separate channel every 15 minutes, or other suitable interval, which indexing tick serves the purpose of providing a subsequent translator device with time interval energy usage information from which to derive the peak energy figure to be applied for the particular given overall energy usage period. These translators generally operate by simply counting and integrating the total pulse count values and retaining the highest individual interval (typically 15, 30 minute or other desired length) pulse count value which has occurred over the total time frame. However, unfortunately, human editing and guessing is required, for the fact is that these mechanical tape recorders are very unreliable in that they vary in speed, and this has the effect of compressing or expanding the data on the tape, and the operator at the translator has to guess and fill in the missing blanks, etc., in attempting to determine the best estimate of what the actual consumption curve actually was. After this raw information has been "edited" the operator conventionally generates a nine-level IBM-type computer tape which is then put into a separate computer to generate the customer billing.

Significant problems are encountered with the prior apparatus and method in failure or variation in rate of drive motors, and the recorders are also very susceptible to temperature changes, and in general have encountered many varied mechanical problems, with resulting breakdowns, inaccuracies and/or, at the least, questionable recordings and billings.

It is a primary object and feature of this invention to replace the present method in which a tape recorder system is used for recording energy usage by a unique method in which peak power and total power usage are recorded in digital form at two respective memory locations in a digital memory, preferably a read-only memory unit which may be removed and which may be grossly erased.

It is a further object and feature to provide a unique method of recording energy usage or consumption, in which digital summation count value signals corresponding to respective succeeding time intervals are recorded as are a digital total summation signal corresponding to the total of all of said time interval signal values, and a peak power digital signal corresponding to the largest single quantity value of said succeeding time interval digital summation signals, all without aid of operator computation, and enabling subsequent machine reading, processing, and/or print-out, or other use as may be desired.

Still a further object is the provision of a solid state recording method for peak power and total power usage in which data thereon is recorded in simple digital summation form at two discrete memory locations in a memory, particularly and preferably a solid state digital memory.

Still a further object, feature and advantage of the invention is the provision of a method for recording of peak power and total power usage as well as discrete interval usage for successive time intervals within a total time period, and which provides a substantial degree of reliability.

Still another object and feature of the invention is the provision of a recording method enabling employment of a reusable removable data cartridge having an ultraviolet light-erasable programmable read-only memory (EPROM) contained within a cartridge case and which is provided with an opaqe overall case or cover over the EPROM or at least that portion of the EPROM which is susceptible to UV light erasure.

Still other objects, features and attendant advantages will become apparent from a reading of the following detailed description of a preferred method of practice in conjunction with a particular preferred physical apparatus, taken in conjunction with the accompanying drawings wherein.

Figure 1:
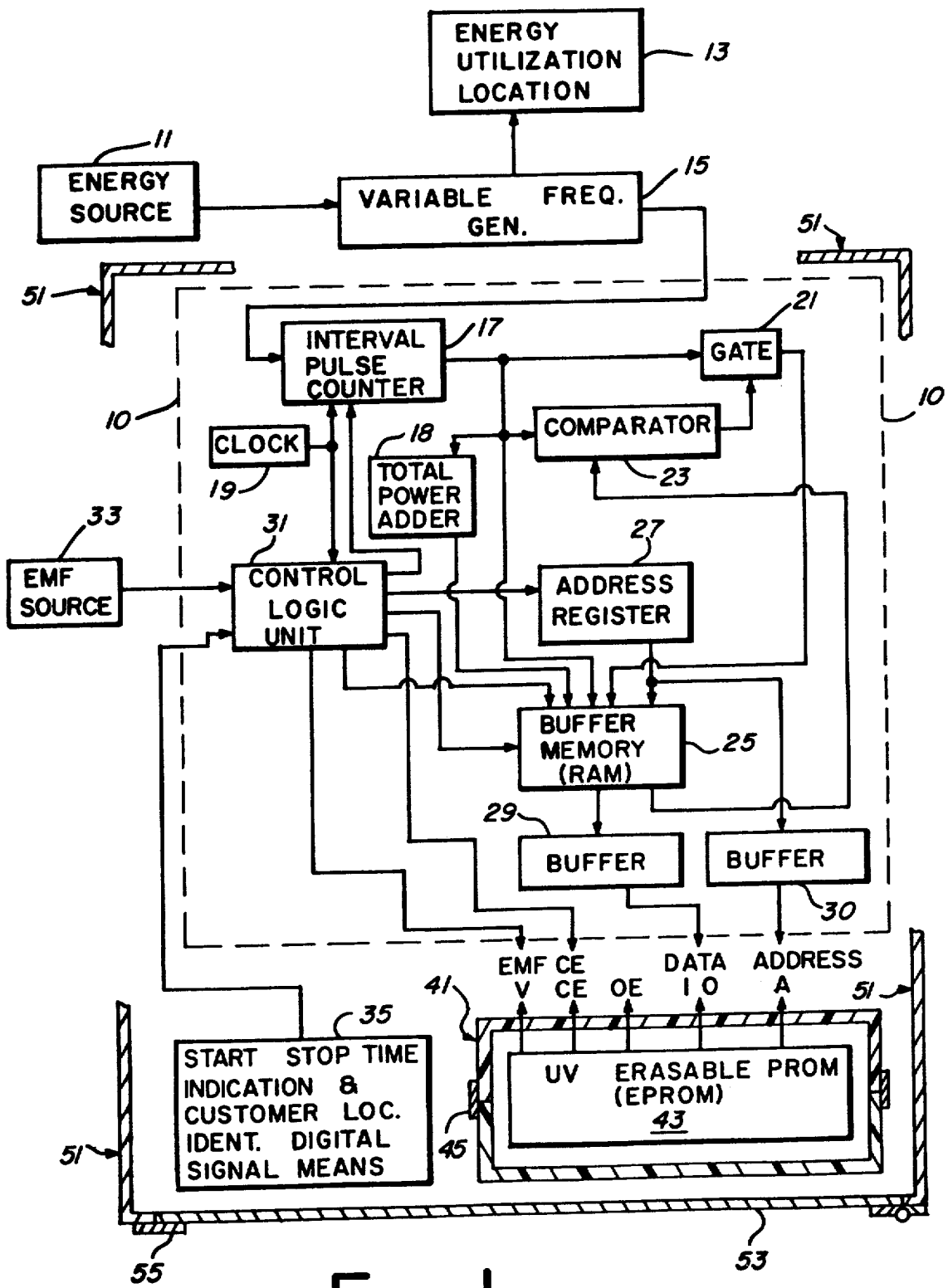
FIG. 1 is a schematic block diagram of an arrangement enabling practice of the method of my invention.

Referring now in detail to the Figures of the drawings, a solid state electronic digital recorder 10 is connected to an energy source such as a conventional EMF power source 11 which connects in energy feeding relation to an energy utilization location through an energy flow responsive variable frequency pulse generator 15 which may be of any conventional or other suitable construction and which yields electrical output pulses at a frequency proportional to the rate of energy flow therethrough to the energy utilization location or facility 13. The generator 15 is shown outside the recorder 10, (but may if desired be within the recorder), as when employing a power flow sensing variable frequency generator as is presently in use at user locations for present tape recorder recording of energy usage.

The electrical pulse output of generator 15 is fed into interval pulse counter 17 which may suitably take the form of a binary digital output counter started, outputted, and reset by a timing clock 19, and appropriate control signals from control logic unit 31, which counter 17 outputs at the end of each interval period of, for instance, 15 minutes, a digital signal indicative of the total interval pulse count for each respective interval period. This interval pulse summation signal is fed to each of gate 21, comparator 23, adder 18, and the input of buffer memory 25 for storage at a desired discrete memory location, which latter buffer memory may suitably be a random access memory.

The output of gate 21 is also connected to the input of buffer memory 25 for storage at a selected discrete memory location. This memory location will have stored therein a signal representative of the undated interval peak power utilization for all interval periods to date within the overall total particular recording period. This is effected by connecting an output from this memory location in buffer memory 25 to one comparison input of comparator 23 while connecting the output of interval pulse counter 17 to another comparison input to comparator 23, with the output from comparator 23 connected to the control input to gate 21, such that if the value of the output signal from interval pulse counter 17 exceeds the value of the interval pulse summation signal fed to comparator 23 from buffer memory 25, the gate 21 will be opened and permit the instant signal from interval pulse counter 17 to pass and be stored in the interval peak power memory location in memory 25 in replacement of the previously stored value. In this manner, the interval summation peak power utilization value will be stored on a continuously updated basis in the respective memory location in buffer memory 25.

The digital input signal from interval pulse counter 17 is also fed into a total power adder 18 which may take the form of a conventional or other desired adder of successive digital input values thereto, and the output from adder 18 may be successively, or only as finally summed if desired, fed into a selected memory location in buffer memory 25 for subsequent transfer into a corresponding or other desired memory location in cartridge memory unit 43. Alternatively, the pulses from generator 15 may be fed to a total pulse counter (not shown) and the final count at the time of record termination, and representative of total power consumed or utilized, may be caused by control logic unit 31 to be fed into a memory location for total power consumption in buffer memory 25 as well as EPROM 43.

Control logic unit 31 is provided for controlling the address register 27, buffer memory 25, and the solid state cartridge memory 43 contained within and forming a part of removable cartridge 41. A suitable EMF source 33 for recorder 10 and cartridge memory 43 is connected to and feeds through the control logic unit 31. Control logic unit 31 serves not only to provide electrical power and control signals to the address register 27, buffer memory 25 and cartridge memory 43, but also serves to transmit signals from a digital signal means 35, which may suitably be a hand-holdable pendant keyboard terminal input unit, for generation of digital signals representative of the times of starting and termination of recording for a given period, as well as customer and/or location or facility identification number and the like, and if desired the identification of the recorder may also be inputted through this signal unit 35.

Control logic unit 31 also has a running clock input from clock 19 for overall timed control of the various units 27, 25 and 43.

In addition to the control signal outputs from control logic unit 31 to address register 27, memory 25 and memory 43, the identification and time indication signals from signal unit 35 are fed through control unit 31 and inputted at selected memory locations in buffer memory 25 for subsequent transfer to and final storage in respective selected memory locations in cartridge memory 43.

Address register 27 and buffer memory 25 may be of conventional or other desired connectibly compatible construction, as may buffer 30 connecting between address register 27 and the address inputs of cartridge memory unit 43 on the one hand, and buffer 29 connecting between buffer memory 25 and the input/output pins of memory unit 43, which latter pins will in the highly preferred embodiment serve solely as one-shot inputs for the purpose of recording data therethrough as will be subsequently further described, and will thereafter serve solely as nonrecordable output pins after removal from the recorder 10, until such time as positive steps are taken to effect erasure of the recorded information on cartridge memory 43.

Cartridge memory 43 takes the form in the highly preferred illustrative embodiment of an ultraviolet light-erasable programmable read-only memory now conventionally referred to as a UV EPROM. This EPROM memory unit 43 is mounted within a plastic or other suitable cartridge case which is substantially opaque to UV light, and with only an electrical pin connector exposed at an edge or face of the cartridge for plug-in in a suitable pin-connection socket on the solid state recorder 10.

The opaque plastic case of cartridge 41 may be suitably openable, as by being separable into two halves or the like, on one of which the EPROM and any associated circuit connections may be mounted, with the UV-sensitive data storage section of the EPROM exposed for erasure after completion of use and upon opening of the case. Suitable tamper prevention seal means 45 may be provided on the cartridge case to aid in enhancing the security of the recorded data on the EPROM memory unit 43.

The respective recorder output pins or pin groups are designated as EMF for EPROM memory chip power output, CE for chip enable signal outputs, DATA for data output, and ADDRESS for address outputs, and the corresponding input pins or pin groups of EPROM memory unit 43 are V for chip DC power input, CE for chip enable, I/O for input/output pins, and A for address pins. The output enable pin OE of EPROM 43 is not connected to the recorder 10, as no read-out is necessary, unless as an option some form of checking is desired, as when an operator removes or is preparing to remove the cartridge 41 from the recorder 10.

The entire solid state electronic recorder 10 and removable solid state memory cartridge 41 are preferably enclosed within a security cabinet, which may have a suitable access door 53 and which door may be suitably sealed as indicated at 55 upon closing and locking by the operator after inserting a fresh cartridge 41 and recording the location and start time information through manually keyed or other suitable input from signal means 35 which is desirably near to the door 53 within cabinet 51, or such unit 35 may be an operator-carried plug-in unit for economy purposes. Upon subsequent return and removal after a suitable desired time period of, for instance, 30-35 days, the door 53 is reopened, after checking the seal 55, and the time of termination of recording is entered by the operator by keying or otherwise actuating signal means 35, whereupon the cartridge 41 is removed for subsequent read-out and processing of its stored data. In each instance, the outputs from signal means 35 may be generated in suitably binary digital form for insertion in the respective memories 25 and 43. While it is possible to insert the outputs from signal means 35, as well as the output from counter 17 directly into the cartridge EPROM memory, the better practice for reliable entry is to employ a buffer memory 25 and buffers 29, whereby input recycling of the input signals to the memory 43 can be effected to ensure entry. Such successive step memory entries may be readily and simply effected by control logic unit 31, as will be readily apparent.

After inserting the fresh fully erased cartridge 41 in the recorder 10 connection socket, the recorder will begin its recording cycle, recording on buffer memory 25 each succeeding interval pulse count summation signal value from interval pulse counter 17, as well as recording the instant updated peak energy utilization signal value for all time intervals to date after the start time. If desired, the commencement of recording may be begun only after and upon completion of entry of the start time, or as an automation alternative the starting of recording may be initiated by the insertion of the cartridge into the recorder socket, or other suitable start routine may be employed. The successive interval pulse count summation digital signals from counter 17 may be sent from buffer memory 25 to cartridge EPROM 41 directly after entry into memory 25 in order to economize on data transfer and operator time at the time of termination of the recording period, although, if desired, such data may be transferred at the end of the recording period. In any event, the final peak power signal value stored in buffer memory 25 is not transferred to cartridge memory EPROM 43 until the end of the recording period. This transfer may suitably be initiated by the control logic unit 31 as a function of either a direct command from the operator signal means 35 after or at the time of entering the stop recording time, or such data transfer may be initiated through control unit 31 automatically in response to the entry of the stop recording time through or from operator signal means 35. While signal means 35 is shown and described as operator controlled, such may be automated as by interlocking with door 53 and/or the cartridge socket of recorder 10 to initiate and terminate recording and initiate entry of data for times of starting and stopping of recording.

As has been generally indicated above, the solid state electronic memory unit of removable cartridge 41 takes the form of an ultraviolet light-erasable programmable read-only memory in the illustrated and highly desirably preferred mode of practice of the method of this invention. While other memory units may be employed within the broad ambit of the overall invention, this preferred mode of practice of the invention offers substantial advantages which materially enhance the invention from both practical and commercial standpoints. Ordinary PROMS are not erasable and thus may not be reused, while the usual electrically erasable PROMs permit the spurious electrical erasure at individual memory locations and subsequent entry of alternate data in lieu of the correct recorded data, thereby rendering the recording less secure and more open to suspicion and falsification or spurious unintended alteration. On the other hand, the UV EPROMs are erasable essentially only by UV light exposure for general practical purposes, and erasure is effected at all memory locations, or otherwise in a gross erasure fashion, without any ability to selectively erase and rewrite a selected given memory location. In addition, once data is entered, no rewrite thereover with different data is possible without first effecting erasure which by its nature is effected as a totality by UV exposure. Accordingly, the employment of a solid state electronic data cartridge 41 with its UV EPROM in practicing this method invention offers major advantages in reliability and security of data and cost of use.

Figure 2:
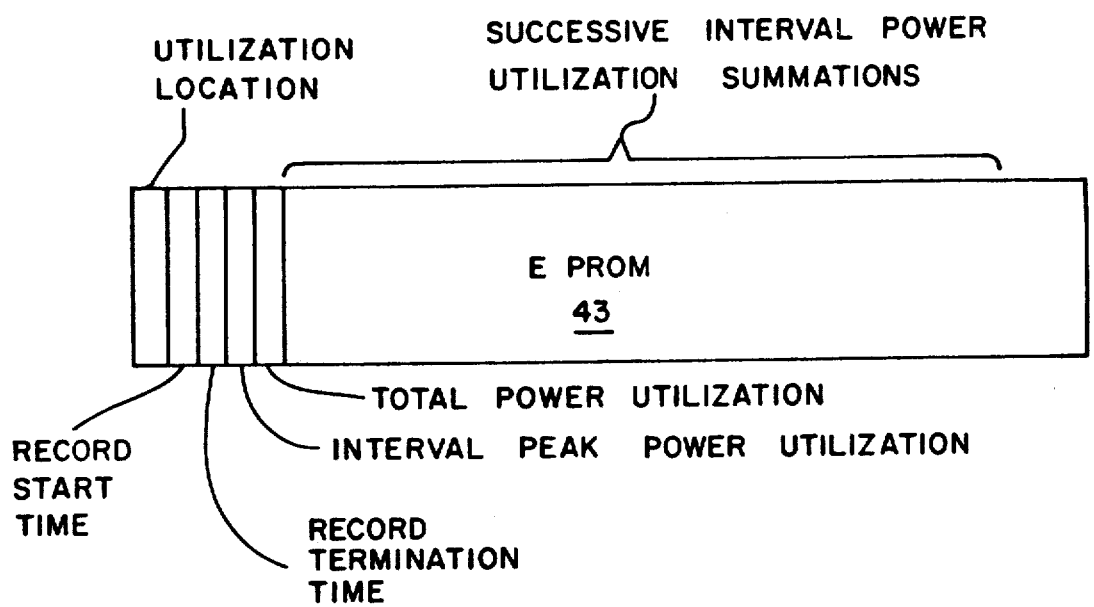
FIG. 2 is a schematic diagrammatic illustration of the general format of recorded data according to a preferred mode of practice of the invention.

FIG. 2 illustrates schematically or diagrammatically a preferred format mode of practice for recording locations for the foregoing described and discussed data on the cartridge EPROM 43. Desirably, the successive interval power summation value signals are stored in a plurality of successive contiguous memory locations on the EPROM, and the data indicating location of the energy utilization facility, the commencement or begin record time, the termination or stop record time, are stored together at the initial memory locations for ease of subsequent read-out acquisition. Likewise, the signals indicating interval peak power utilization and total power utilization (which is indicated as the sum of all recorded successive interval power accumulation values) are desirably also accessible adjacent the time and location header information on the EPROM. Accordingly the interval peak power and total power utilization data are preferably stored immediately after the location and time start/stop record data. However, other data memory locations and modes of arrangement of the data might of course be used if so desired, within the broad ambit of my invention.

While the invention has been illustrated and described with respect to its preferred practice through employment of an illustrative apparatus, it will be apparent that various modifications and improvements may be made without departing from the scope and spirit of the invention. For instance, while the invention is shown as practiced through use of an overall generally hardware system, with an optionally hardware and/or software control logic unit, the method may also be practiced by use of a recorder which may to a substantial degree be embodied in software. Accordingly, it is to be understood that the invention is not to be limited by the particular illustrative embodiment, but only by the scope of the appended Claims.

I claim:

1. The method of recording the amounts of energy utilized or consumed at a given location or facility, comprising
    transmitting discrete count signals varying in rate as a function of the rate of energy use,
    counting the quantity of said discrete count signals during succeeding discrete time intervals to produce succeeding interval summation count value digital signals,
    recording said succeeding interval summation digital count value digital signals at discrete individual locations in a record medium for subsequent readout, comparing said succeeding interval summation count value digital signals, said comparing being effected by successively comparing each succeeding said interval summation count value signal with the then highest of the preceding said interval summation count value signals for each of the preceding discrete intervals of said given time period, recording idicia, in digital form, representing peak interval summation digital count value, at a respective discrete location on said record medium, the highest of said interval summation digital count values occurring during a given total recording period composed of a plurality of said succeeding time intervals, summing the interval summation digital count values represented by said interval summation count value digital signals over said given total recording period to thereby provide a grand total energy or power utilization or consumption digital value for said given total recording period, and recording said grand total energy or power utilization or consumption value as a digital signal at a respective discrete location in said record medium.

2. The method according to claim 1 further comprising, forming an indicia on said record medium which identifies the particular location for which energy use is recorded in said memory.

3. The method according to claim 2, further comprising forming said location indicia in digital signal form, and recording such digital form indicia signal as a discrete digital indicia at a discrete location on said record medium.

4. The method according to claim 3 further comprising, recording indicia on said record medium indicative of the start and conclusion of said given total recording period.

5. The method according to claim 4, in which said start/conclusion indicia are recorded by forming start/conclusion signals in digital form, and recording such digital form start/conclusion digital signals as respective discrete digital indicia at a discrete location on said record medium.

6. The method according to claim 1 further comprising, transmitting said discrete count signals as electrical pulses.

7. The method according to claim 6, further comprising forming said location indicia in digital signal form, and recording such digital form indicia signal as a discrete digital indicia at a discrete location on said record medium.

8. The method according to claim 7, in which said start/conclusion indicia are recorded by forming start/conclusion signals in digital form, and recording such digital form start/conclusion digital signals as respective discrete digital indicia at a discrete location on said record medium.

9. The method according to claim 1 further comprising, effecting said recording on a removable solid state read-only memory unit.

10. The method according to claim 9 further comprising, effecting said recording on a removable solid state read-only memory unit.

11. The method according to claim 9 further comprising, effecting said recording by application to said record medium of energy in one form for data entry recording, and employing a said record medium which is not erasable by further application of energy in said one form but which is grossly erasable, but not discretely erasable as to individual discrete record locations, by application of energy in another form.

12. The method according to claim 11 in which, said recording is effected on a UV erasable EPROM.

13. The method according to claim 11 further comprising, subsequently reading the said recorded energy use information stored in said record medium for said total time period, and grossly subsequently erasing said record energy use information from said memory by application to said record medium of energy in a different form from said one form employed for data entry recording.

14. The method according to claim 13 in which, said recording is effected on a UV erasable EPROM.

15. The method according to claim 1 in which, said recording is effected on an erasable programmable read-only memory.

16. The method according to claim 1, in which said comparing is effected by storing in an updatable storage medium the first of said interval summation count value signals as representing the current interval summation peak value for said given total recording period, comparing each succeeding said interval summation count value signal with the then stored interval summation count value signal representing the current interval peak value, and selectively substituting any one of said succeeding summation count value signals for the then current peak value summation count value signal presently in said storage medium, when such succeeding interval summation count value is larger in value than the then stored interval summation count value, thereby providing in said storage medium an updated interval summation peak value for the given recording period.

17. The method according to claim 16 in which, said recording in digital signal form, of a digital signal representing the final peak interval summation digital count value during a given total recording period, is effected after the conclusion of the last of said succeeding time intervals and is effected by recording on said record medium a digital signal corresponding to the value of the last interval summation count value signal appearing in said storage medium after the conclusion of the last of said succeeding time intervals and the effecting of said count value comparison and count value substitution steps.

18. The method according to claim 17 further comprising, storing updated summations of said discrete time intervals on an updatable storage medium, and recording on said record medium, the final updated summation present on said updatable storage medium, as the grand total energy or power utilization or consumption value at the conclusion of said given total recording period.

19. The method according to claim 17, further comprising after each said succeeding time interval, summating the summations of all preceding time intervals and storing the resulting summated value as a digital signal on a storage medium, and recording the final said instant updated total summation as the grand total energy or power utilization or consumption value at the conclusion of said given total recording period.

20. The method according to claim 19, further comprising storing, at respective individual discrete locations in a storage medium, a respective digital signal representing respectively each of said succeeding individual interval summation count values after the conclusion of each such individual interval summation, and recording the said stored succeeding interval summation count values as digital signals at respective discrete locations in said record medium after the conclusion of the final time interval in said given total recording period.

21. The method according to claim 16 further comprising, storing updated summations of said discrete time intervals on an updatable storage medium, and recording on said record medium, the final updated summation present on said updatable storage medium, as the grand total energy or power utilization or consumption value at the conclusion of said given total recording period.

22. The method according to claim 16, further comprising after each said succeeding time interval, summating the summations of all preceding time intervals and storing the resulting summated value as a digital signal on a storage medium, and recording the final said instant updated total summation as the grand total energy or power utilization or consumption value at the conclusion of said given total recording period.

23. The method according to claim 16, further comprising after each said succeeding time interval, summating the summations of all preceding time intervals and storing the resulting updated summated value as a digital signal on a storage medium, and recording the final said instant updated summation as the grand total energy or power utilization or consumption value at the conclusion of said given total recording period.

24. The method according to claim 16 in which, said recording as a peak interval summation count value, of the highest of said interval summation values occurring during a given total recording period, is effected at the conclusion of the last of said succeeding time intervals and being effected by recording, on said record medium, of a digital signal corresponding to the value of the final updated interval summation count signal appearing in said storage medium after the conclusion of the last of said succeeding time intervals and the effecting of said count value comparison and count value substitution steps, and further comprising storing the instant updated summation of all preceding time intervals on a storage medium, and recording on said record medium the final said instant updated summation as a digital signal representing the grand total energy or power utilization or consumption value at the conclusion of said given total recording period.

25. The method according to claim 24 in which, said storing of the various said count value signals is effected in a common storage medium.

26. The method according to claim 25, in which said storing of the various said count value signals is effected in a buffer storage memory, and said recording is effected from the signals in said buffer storage memory.

27. The method according to claim 1 further comprising, storing updated summations of said discrete time intervals on an updatable storage medium, and recording on said record medium, the final updated summation present on said updatable storage medium, as the grand total energy or power utilization or consumption value at the conclusion of said given total recording period.

28. The method according to claim 1, in which said forming of succeeding interval summation count value digital signals are formed by counting the quantity of discrete count signals during each succeeding time interval to thereby provide a summation digital signal representative of said count for each of said intervals.

29. The method according to claim 28, including transmitting discrete count signals varying in rate as a function of the rate of energy use.

30. The method of recording the amounts of energy utilized or consumed at a given location or facility, comprising forming succeeding interval summation count value digital signals representative of quantity of energy use for each of a plurality of succeeding discrete time intervals over a given total time period, recording such succeeding interval summation digital count value digital signals at discrete individual locations on a solid state stationary electronic record medium for subsequent read-out, comparing said succeeding interval summation count value digital signals, said comparing being effected by successively comparing each succeeding said interval summation count value signal with the then highest of the preceding said interval summation count value signals for each of the preceding discrete intervals of said given time period, deriving from said comparing, a digital signal representing peak interval summation digital count value, the highest digital count value of said interval summation digital signals occurring during a given total recording period composed of a plurality of said succeeding time intervals, recording an indicia representative of the value of said peak interval summation digital count value, summing the interval summation digital count values represented by said interval summation count value digital signals over said given total recording period to thereby provide a grand total energy or power utilization or consumption digital value for said given total recording period, and recording said grand total energy or power utilization or consumption value as a digital signal at a respective discrete location on a record medium.

31. The method according to claim 30, in which said comparing is effected by storing in an updatable storage medium the first of said interval summation count value signals as the current interval summation peak value for said given total recording period, comparing each succeeding said interval summation count value signal with the then stored interval summation count value signal representing the current interval peak value.

32. The method according to claim 31, in which said recording of an indicia representing the final peak interval summation signal count value during a given total recording period, is effected after the conclusion of the last of said succeeding time intervals and is effected by recording on a record medium a digital signal corresponding to the value of the last interval summation count value signal appearing in said storage medium after the conclusion of the last of said succeeding time intervals and the effecting of said count value comparison and count value substitution steps.

33. The method of recording the amounts of energy utilized or consumed at a given location or facility, comprising forming succeeding interval summation count value digital signals representative of quantity of energy use for each of a plurality of succeeding discrete time intervals over a given total time period, recording said succeeding interval summation digital count value digital signals at discrete individual locations on a solid state stationary electronic record medium for subsequent read-out, comparing said succeeding interval summation count value digital signals, said comparing being effected by successively comparing each succeeding said interval summation count value signal with the then highest of the preceding said interval summation count value signals for each of the preceding discrete intervals of said given time period, recording at a respective discrete location on said record medium, an indicia in digital form representing peak interval summation digital count value, the highest digital count value of said interval summation digital signals occurring during a given total recording period composed of a plurality of said succeeding time intervals, summing the interval summation digital count values represented by said interval summation count value digital signals over said given total recording period to thereby provide a grand total energy or power utilization or consumption digital value for said given total recording period, and recording said grand total energy or power utilization or consumption value as a digital signal at a respective discrete location on said record medium.

34. The method according to claim 33, in which said comparing is effected by storing in an updatable storage medium the first of said interval summation count value signals as the current interval summation peak value for said given total recording period, comparing each succeeding said interval summation count value signal with the then stored interval summation count value signal representing the current interval peak value.

35. The method according to claim 34, in which said recording of an indicia representing the final peak interval summation signal count value during a given total recording period, is effected after the conclusion of the last of said succeeding time intervals and is effected by recording on a record medium a digital signal corresponding to the value of the last interval summation count value signal appearing in said storage medium after the conclusion of the last of said succeeding time intervals and the effecting of said count value comparison and count value substitution steps.

* * * * *